United States Patent

[19]

Julian et al.

[11] Patent Number: 6,137,703

[45] Date of Patent: Oct. 24, 2000

[54] CLAMPED BIDIRECTIONAL POWER SWITCHES

[75] Inventors: Alexander L. Julian, Vernon; Joseph DiTucci, Simsbury, both of Conn.

[73] Assignee: Otis Elevator Company, Farmington, Conn.

[21] Appl. No.: 09/447,651

[22] Filed: Nov. 23, 1999

[51] Int. Cl.[7] .................................................. H02M 7/155
[52] U.S. Cl. ............................................................. 363/127
[58] Field of Search ...................................... 363/127, 132

[56] References Cited

U.S. PATENT DOCUMENTS

| 5,459,655 | 10/1995 | Mori et al. | 363/132 |
|---|---|---|---|
| 5,731,970 | 3/1998 | Mori et al. | 363/132 |
| 5,801,936 | 9/1998 | Mori et al. | 363/132 |
| 5,953,222 | 9/1999 | Mizutani | 363/132 |
| 6,028,779 | 2/2000 | Sakamoto et al. | 363/132 |
| 6,058,028 | 5/2000 | Czerwinski | 363/44 |
| 6,058,031 | 5/2000 | Lyons et al. | 363/132 |
| 6,067,242 | 5/2000 | Kawaguchi | 363/127 |
| 6,072,707 | 6/2000 | Hochgraf | 363/132 |

OTHER PUBLICATIONS

P. Nielsen, F. Blaabjerg, J.K. Pedersen, "Novel Solutions for Protection of Matrix Converter to Three Phase Induction Machine", IEEE/IAS Annual Meeting, Oct. 1997, pp. 1447–1454.

*Primary Examiner*—Jeffrey Sterrett

[57] ABSTRACT

A bidirectional solid state power switch module includes two solid state switches, each having an antiparallel diode, connected in common electrode configuration by a juncture therebetween. A pair of unilaterally conductive paths, each poled to conduct in a direction to maintain current through the switch module which is cut off by turning off the adjacent switch, each connected to an extreme end of the switch module, the other end of said first unilaterally conductive paths being connected together to a first side of a capacitor, the opposite end of the capacitor being connected through a unilaterally conductive path to the juncture between the two switches, said second unilaterally conductive path being poled to conduct current that passes through either of said first paths and said capacitor. Upon cutoff of one of said switches, current flows through one of said first unilaterally conductive paths, said capacitor, and said second unilaterally conductive path and through the antidiode of the other of said switches. Since the voltage across the capacitor is always opposite to the conductivity of the unilaterally conductive paths with which it is in series, the capacitor of one such clamp can be connected in parallel with the capacitor of other clamps, and the voltage thereacross regulated by a single regulator, such as a resistor fed through a solid state switch controlled by a threshold detector.

9 Claims, 2 Drawing Sheets

CLAMPED BIDIRECTIONAL POWER SWITCHES

TECHNICAL FIELD

This invention relates to a clamp circuit for protecting solid state power switches, in a bidirectional switch configuration, from excessively high voltage attendant turn-off of each switch.

BACKGROUND ART

Conversion of three-phase AC power to DC power is frequently accomplished with bridge circuits utilizing solid state switching devices, such as insulated gate bipolar transistors (IGBTs). In some applications, such as certain applications for providing power to elevators, for returning regenerative power from the elevator to the power grid, bidirectional switch modules may be employed, each module including a controllable solid state switch (such as an IGBT) having an anti-parallel diode connected thereacross in series with an oppositely poled switch and diode, in a common electrode configuration (either common emitter or common collector). As is known, during commutation from switch to switch which provides the desired DC voltage, load and circuit inductances tend to maintain current flow as the switch ceases conducting, the inductances within the bridge circuitry thereby creating large inductive reaction back voltages across the turned-off switch. Frequently, the back voltages will exceed the reverse voltage capacity of a switch. Therefore, clamp circuits have been known to prevent high reverse voltages upon switch turnoff. One such circuit is illustrated in FIG. 1, in which, by way of example, an IGBT 8 and its anti-parallel diode 9 are connected in common emitter configuration with an IGBT 10 and an anti-parallel diode 11. A clamp 12 for the bidirectional switch module 7 consists of four diodes 13–16, a capacitor 19 and a resistor 20. Consider the case when the IGBT 8 is conducting: current flows downwardly through it and down through the diode 11. Since the IGBT 8 and diode 11 constitute essentially short circuits, no current flows through the clamp 12. When the IGBT 8 is turned off, current can no longer flow therethrough, so it flows through the diode 14, the capacitor 19 and resistor 20, and the diode 15. The reverse voltage is built up across the capacitor 19, which eventually dissipates all of the energy through the resistor 20. In order for this device to be operable, it must be able to dissipate all of the energy that may be stored in the capacitor 19 prior to the next commutation event. Instead of acting as a snubber to cause the voltage of the capacitor to return to zero volts after each commutation event, if the device were operated as a regulated clamp, the back voltage across each IGBT, when turned off, could be maintained at a voltage just below the reverse voltage rating for the IGBT. However, in order to do so, a separate regulator would have to be supplied for each of the clamps 12 in the circuit. In fact, a clamp of the type shown in FIG. 1 is useful only for very low power applications.

DISCLOSURE OF INVENTION

Objects of the invention include provision of a clamp for high power, bidirectional solid state power switches, and provision of the high power switch clamp which can be regulated by a single circuit.

This invention is predicated on the discovery that a clamp circuit for high power, solid state switches can receive energy from the switching module, acting as a sink, thereby limiting voltage across switches as they are turned off, but nonetheless be isolated from acting as a voltage source with respect to the switch module. This invention is further predicated on the concept that once the clamp circuit is isolated from the switch module, all clamp circuits in a switched bridge may be connected in parallel and regulated by a single voltage regulator.

According to the present invention, a bidirectional switch module having a pair of oppositely connected solid state switches with antiparallel diodes, has a first pair of diodes, one connected to each extreme end of the switch module, each first diode poled to conduct current in the same direction as current flowing through said module before turning off one of the solid state switches therein, both of said first diodes being connected to the same side of a capacitor, the other side of said capacitor being connected by a diode path to the juncture between said two electronic switches, whereby current cut off from one of said electronic switches will flow through one of said first diodes, said capacitor, said second diode path, and through the anti-parallel diode associated with the other of said electronic switches.

In further accord with the invention, the voltage across said capacitor may be regulated by selective discharge through a resistor.

In still further accord with said invention, a bridge comprising a plurality of said clamped switch modules may have all of their capacitors connected in parallel, the voltage across said capacitors being regulated by a single regulator, which may comprise selectively discharging said capacitors through a resistor or some other energy sink, such as a battery or an AC source.

In accordance further with the invention, where the juncture between the solid state switches is long and provides significant inductance between the two switches, separate diodes are utilized to connect the clamp capacitor directly to the juncture, each diode connected close to one of the solid state switches.

Other objects, features and advantages of the present invention will become more apparent in the light of the following detailed description of exemplary embodiments thereof, as illustrated in the accompanying drawing.

BEST MODE FOR CARRYING OUT THE INVENTION

Figure 1:
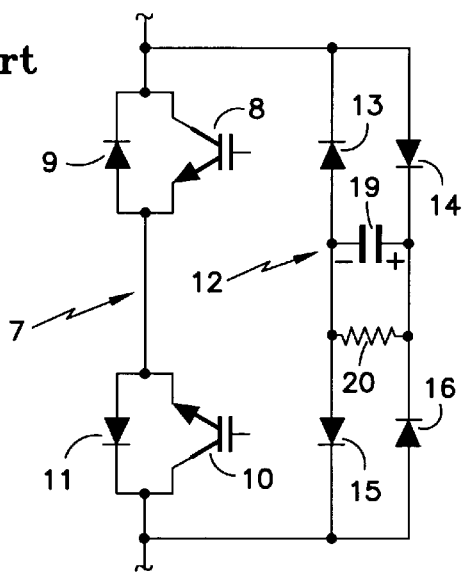
FIG. 1 is a schematic diagram of a clamp circuit known to the prior art.
Figure 2:
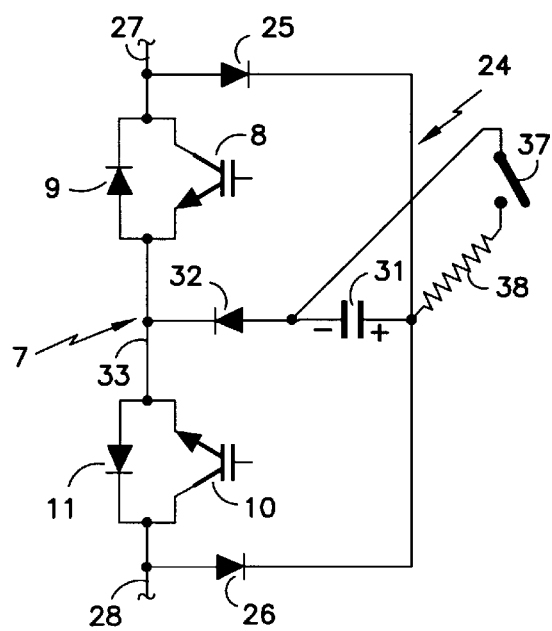
FIG. 2 is a schematic diagram of a basic embodiment of the present invention.

Referring to FIG. 2, the present invention has a pair of first diodes 25, 26 connected to the extreme ends 27, 28 of the switch module 7, poled to conduct so as to continue current flow which may be blocked by turnoff of the adjacent one of the electronic switches 8, 10. The opposite sides of the diodes 25, 26 are connected together with one side of a capacitor 31, the other side of which is connected through a second diode 32 to the juncture 33 between the two electronic switches. In a case where current is flowing from the end 27 downwardly through the switch 8 and the diode 11 to the end 28, should current be interrupted by turning off the switch 8, the current will continue to flow through the first diode 25, into the capacitor 31, through the second diode 32, and through the diode 11 to the end 28. Similarly, if current is flowing upwardly from the end 28, through the switch 10, through the diode 9 to the end 27, should current be interrupted by turning off switch 10, the current will continue to flow through the first diode 26, the capacitor 31, the second diode 32, and through the diode 9 to the end 27. In each case, voltage across the capacitor is positive on the side of the first diodes 25 and 26 to negative on the side of the second diode 32. In accordance with the invention, rather than having a resistor tied across the capacitor 31 (similar to the elements 19, 20 in FIG. 1), the voltage is not returned to zero with each commutation, but rather it is regulated at a voltage just below the reverse voltage rating of the switches 8, 10. This is achieved by periodic closing of a circuit, such as through a switch 37 which will dissipate energy in a resistor 38. This is described more fully with respect to the embodiment of FIG. 4.

Figure 3:
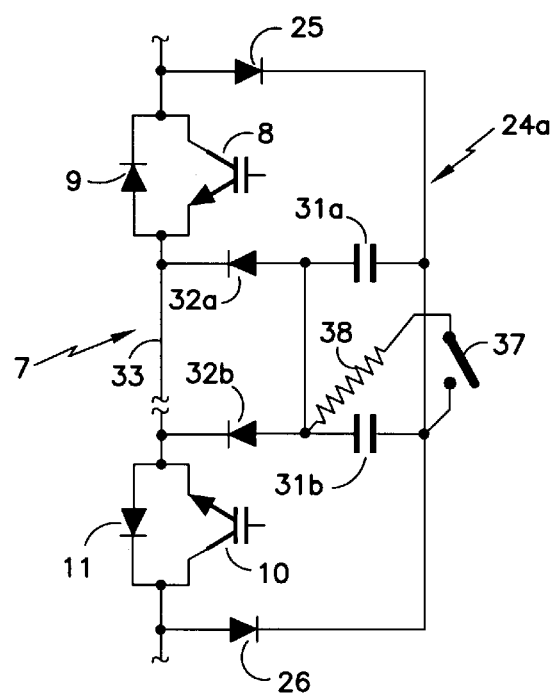
FIG. 3 is a schematic diagram of a modification of the invention which accommodates inductance between the switches of a module.

In FIG. 3, instead of a single diode 32 and single capacitor 31, two diodes 32a and 32b connect the negative side of two capacitors 31a and 31b very closely to the corresponding switches 8, 10. The two diodes 32a, 32b not only provide a direct path for the main current flow immediately after turnoff of one of the switches 8, 10, but also provide a path for continuity of flow within the juncture 33 between the two switches. For instance, if current were flowing downwardly from the end 27 through the switch 8 and the diode 11 to the end 28, when the switch 8 is turned off, current will flow through the diode 25, the capacitor 31a, the diode 32a and the diode 11 to the end 28. In a circuit with switches 8 and 10 separated by on the order of 2–5 inches, which may have inductance as high as several hundred nanohenries, current flow in the juncture 33 is maintained by flow through the diode 25, the capacitor 31a, and diode 32a, the junction 33 and the diode 11 to the end 28. Similar paths exist for current flowing upwardly when interrupted. When the switches 8, 10 are mounted close to each other (fractions of an inch), the arrangement of FIG. 2 is usually adequate; but when the distance between the two switches 8, 10 exceeds two inches, then use of two diodes 32, 32b as in FIG. 3 is appropriate.

The embodiments of FIG. 2 and FIG. 3 are illustrated with common emitter switch configurations. However, the invention may be utilized with common collector configurations by reversing the polarity of each of the clamp diodes. In such a case, the voltage across the capacitor will be opposite the voltage shown in FIGS. 2 and 3.

Figure 4:
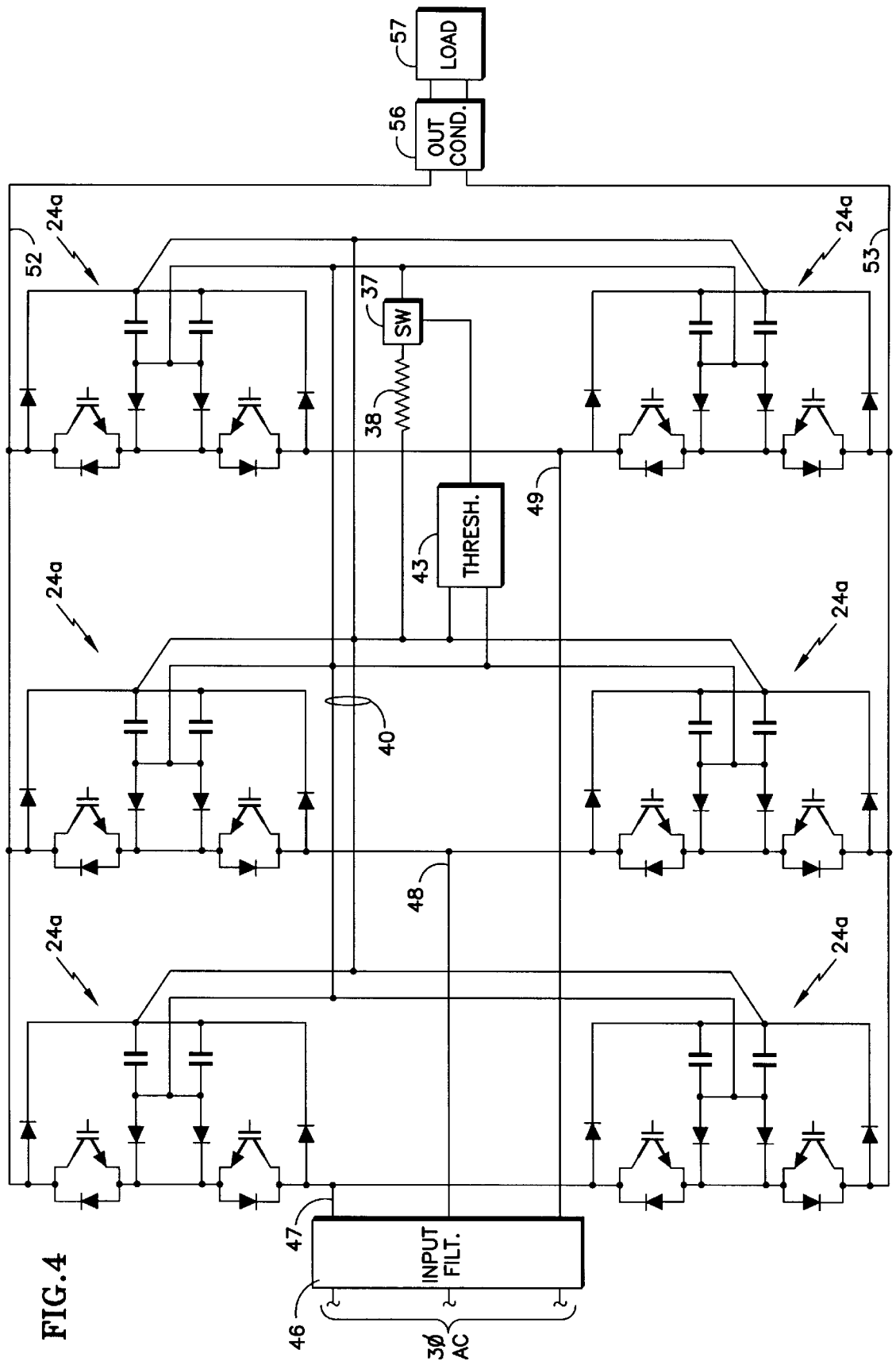
FIG. 4 is a schematic diagram of a solid state switched bridge employing the clamped switch module of the present invention illustrated in FIG. 3.

In FIG. 4, six bidirectional switch modules 7 each are associated with a corresponding four-diode clamp 24a, the capacitors 31a and 31b of each of the clamps 24a being interconnected in parallel by a bus 40. The energy dissipating resistor 38 is connected through the switch 7 between the two sides of the bus 40. The switch 37 is turned on and off in response to a threshold circuit 43, which will operate the switch 37 whenever the voltage on the bus 40 exceeds a selected voltage, which is below the reverse voltage rating of the switches 8, 10. When the voltage decreases sufficiently, the switch 37 will again be open.

The arrangement of FIG. 4 is a switched bridge. The three-phase AC mains are connected through an input filter 46 to three phases 47–49, each phase being connected to a pair of switch modules 7. The other sides of the switch modules comprise rails 52, 53 of a DC bus which is connected through output conditioning 56 to a load 57. The load 57 may, for instance, be a DC motor of an elevator. The switch modules 7 may be controlled by a conventional pulse width modulation switch driver, in which case the output conditioning 56 will include an inductor to average the voltage pulses applied to the load to provide a desired DC voltage, and it may also contain output filtering. The switch modules 7 may be operated as an AC/DC matrix converter, such as is disclosed in commonly owned, copending U.S. patent application Ser. No. 09/310,600, filed May 12, 1999 and Ser. No. 09/310,393 filed May 12, 1999. In such a case, the output conditioning 56 need only comprise output filtering. The input filter 46 may be passive, or it may be an active filter as described in commonly owned, copending U.S. patent application Ser. No. 09/427,470 filed Oct. 26, 1999.

All of the aforementioned patent applications are incorporated herein by reference.

Thus, although the invention has been shown and described with respect to exemplary embodiments thereof, it should be understood by those skilled in the art that the foregoing and various other changes, omissions and additions may be made therein and thereto, without departing from the spirit and scope of the invention.

We claim:

1. A clamped, bidirectional, solid state power switch module, comprising:

a pair of solid state power switches having first and second main, current carrying electrodes, a first one of said electrodes of both of said power switches being connected together in common electrode configuration by a juncture;

a capacitor having two sides;

a pair of first unilaterally conductive paths, each extending from a second one of said electrodes of one of said switches, each said path extending to a first side of said capacitor, each said path poled to maintain current flow in said clamped switch module in the same direction as the one of said switches to which it is connected;

a second unilaterally conductive path extending from a second side of said capacitor to said juncture, said second path poled to conduct current flowing through one of said first paths and said capacitor;

and a voltage regulator connected across said capacitor to regulate the voltage thereacross.

2. A clamped switch module according to claim 1 wherein:

said voltage regulator comprises a resistor in series with a regulating switch.

3. A clamped switch module according to claim 2, further comprising:

a threshold detector responsive to the voltage across said capacitor for closing said regulating switch when the voltage across said capacitor exceeds a selected voltage.

4. A clamped switch module according to claim 3 wherein:

said selected voltage is equal to or less than a reverse voltage limit of said power switches.

5. A clamped switch module according to claim 1, further comprising:

a third unilaterally conductive path extending from said second side of said capacitor to a point on said juncture which is close to a first one of said power switches; and wherein said second unilaterally conductive path is connected to a point on said juncture which is close to a second one of said power switches.

6. A clamped switch module according to claim 5 further comprising:
   a second capacitor connected in parallel with said first capacitor; and wherein:
   said first capacitor is disposed near said second unilaterally conductive path and said second capacitor is disposed near said third unilaterally conductive path.

7. A clamped switch module according to claim 1 wherein:
   said switches comprise IGBTs with anti-parallel diodes.

8. A switched bridge AC/DC converter, comprising:
   a clamped switch module according to claim 1; and further comprising:
   a plurality of additional clamped, bidirectional, solid state power switch modules, each comprising:
      a pair of additional solid state power switches, each having third and fourth main, current carrying electrodes, a third one of said electrodes of both of said additional power switches being connected together in common electrode configuration by a second juncture;
      an additional capacitor having two sides;
      a pair of third unilaterally conductive paths, each extending from a fourth one of said main electrodes, each said third path extending to a first side of said additional capacitor, each said third path poled to maintain current flow in said corresponding additional switch module in the same direction as the one of said additional switches to which it is connected;
      a fourth unilaterally conductive path extending from a second side of said additional capacitor to said second juncture, said fourth path poled to conduct current flowing through one of said third paths and said additional capacitor; and wherein:
   the capacitors of all of said clamped switch modules are connected in parallel, whereby said voltage regulator regulates the voltage across all of said capacitors simultaneously.

9. A switched bridge AC/DC converter, comprising:

a plurality of pairs of solid state power switches, each having first and second main, current carrying electrodes, a first one of said electrodes of both of said power switches in a pair being connected together in common electrode configuration by a juncture;

a plurality of capacitors each having two sides;

a plurality of pairs of first unilaterally conductive paths, each extending from a second one of said electrodes of one of said switches, each said path extending to a first side of one of said capacitors, each said path poled to maintain current flow in said clamped switch module in the same direction as the one of said switches to which it is connected;

a plurality of second unilaterally conductive paths, each extending from a second side of one of said capacitors to a corresponding one of said junctures, each of said second paths poled to conduct current flowing through one of said first paths and a corresponding one of said capacitors, the capacitors of all of said clamped switch modules being connected in parallel;

and a voltage regulator connected across said capacitors to regulate the voltage thereacross.

* * * * *